United States Patent
Carmel et al.

(10) Patent No.: US 8,076,991 B2
(45) Date of Patent: Dec. 13, 2011

(54) FREQUENCY HOPPING BAND-STOP FILTER

(75) Inventors: Travis D. Carmel, Victor, NY (US);
Steven W. Bonter, Hilton, NY (US);
Sean D. Rafferty, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 283 days.

(21) Appl. No.: 12/497,858

(22) Filed: Jul. 6, 2009

(65) Prior Publication Data
US 2011/0001573 A1    Jan. 6, 2011

(51) Int. Cl.
*H04B 3/04* (2006.01)
*H03H 7/24* (2006.01)
(52) U.S. Cl. ..................... 333/17.1; 333/17.3
(58) Field of Classification Search .............. 333/17.1, 333/17.3, 109; 455/73
See application file for complete search history.

(56) References Cited

U.S. PATENT DOCUMENTS

| | | | |
|---|---|---|---|
| 3,715,690 A * | 2/1973 | Young et al. | 333/17.1 |
| 5,202,656 A | 4/1993 | Clark et al. | |
| 5,625,894 A | 4/1997 | Jou | |
| 6,020,783 A | 2/2000 | Coppola | |
| 7,050,762 B2 * | 5/2006 | Boldt et al. | 455/73 |
| 7,323,955 B2 | 1/2008 | Jachowski | |

* cited by examiner

*Primary Examiner* — Dean O Takaoka
(74) *Attorney, Agent, or Firm* — Fox Rothschild, LLP; Robert J. Sacco

(57) ABSTRACT

A digitally-tunable filter includes a tunable filter circuit (110) for generating an output signal by processing an input signal based at least on a plurality of filter control signals (114). The filter also includes an input power sampler (118) for sampling an input power of the input signal, an output power sampler (120) for sampling an output power of the output signal, and a tuning processor (112) for generating the plurality of filter control signals based on at least one channel control signal (116) associated with a current communications channel and a comparison of the input and the output powers. In the filter, the plurality of control signals configure the tunable filter circuit to attenuate at least a portion of the input signal if a difference between the input power and the output power is less than a threshold value.

20 Claims, 5 Drawing Sheets

FREQUENCY HOPPING BAND-STOP FILTER

FIELD OF THE INVENTION

The present invention relates to filter circuits in frequency hopping or other communications systems, and more specifically to frequency hopping band-stop filter circuits

BACKGROUND

Frequency-hopping (FH) communications are a spread spectrum method of transmitting radio signals. In general, frequency hopping involves rapidly switching a carrier among many frequency channels, using a pseudorandom sequence known to both transmitter and receiver. It is typically utilized as a multiple access method in the frequency-hopping code division multiple access (FH-CDMA) scheme.

Spread-spectrum transmission techniques, including FH techniques, typically provide numerous advantages over fixed-frequency transmission techniques. First, spread-spectrum signals are generally highly resistant to narrowband interference. The process of re-collecting a spread signal typically spreads out the interfering signal, causing it to recede into the background. Second, spread-spectrum signals are typically difficult to intercept. In general, a spread spectrum signal, such as an FH signal, appears as an increase in the background noise to a narrowband receiver. As a result, a potential eavesdropper would only be able to intercept the transmission if they knew the pseudorandom sequence. Third, spread-spectrum transmissions can generally be configured to share a frequency band with many types of conventional transmissions with minimal interference. The spread-spectrum signals typically add minimal noise to the narrow-frequency communications, and vice versa. As a result, bandwidth can be utilized more efficiently.

However, spread spectrum communications, including FH spread spectrum communications are still susceptible to emissions from collocated radio frequency emitters. In the case of critical mission communications, such as in military or public safety communications, this can result in loss or corruption of information during reception.

SUMMARY

Embodiments of the present invention describe systems and methods for providing digitally tuned, frequency hopping band stop filtering. In a first embodiment of the invention, a digitally tuned filter is provided. The filter includes a tunable filter circuit for generating an output signal by processing an input signal based at least on a plurality of filter control signals. The filter also includes an input power sampler for sampling an input power of the input signal and an output power sampler for sampling an output power of the output signal. The filter further includes a tuning processor for generating the plurality of filter control signals based on at least one channel control signal associated with a communications channel and a comparison of the input and the output powers. In the filter, the plurality of control signals configure the tunable filter circuit to attenuate at least a portion of the input signal if a difference between the input power and the output power is less than a threshold value.

In a second embodiment of the invention, a method of reducing interference in a communications system is provided. The system includes a tunable filter circuit for receiving an input signal and outputting an output signal, and a tuning processor for generating a plurality of filter control signals for the tunable filter circuit. The method includes the steps of generating the plurality of filter control signals based on at least one channel control signal associated with a current communications channel. The method also includes the step of generating the output signal using the tunable filter circuit by processing the input signal based at least on the plurality of filter control signals. The method further includes the steps of sampling an input power of the input signal and sampling an output power of the output signal. The method additionally includes modifying the plurality of filter control signals based on a comparison of the input and the output powers. In the method, the plurality of control signals configure the tunable filter circuit to attenuate at least a portion of the input signal if a difference between the input power and the output power is less than a threshold value.

In a third embodiment of the invention, a digitally tuned filter circuit is provided. The circuit includes a tunable filter circuit having a plurality of fixed filter elements for processing an input signal to generate an output signal and a plurality of selectable filter elements for modifying a frequency response of the plurality of fixed filter elements based on at least a plurality of filter control signals. The circuit also includes an input power sampler for sampling an input power of the input signal and an output power sampler for sampling an output power of the output signal. The circuit further includes a tuning processor for generating the plurality of filter control signals based on at least one frequency hopping (FH) control signal associated with a current FH victim receive frequency for the input signal and a comparison of the input and the output powers. In the circuit, the plurality of control signals configure the tunable filter circuit to attenuate at least a portion of the input signal if a difference between the input power and the output power is less than a threshold value.

DETAILED DESCRIPTION

Figure 1:
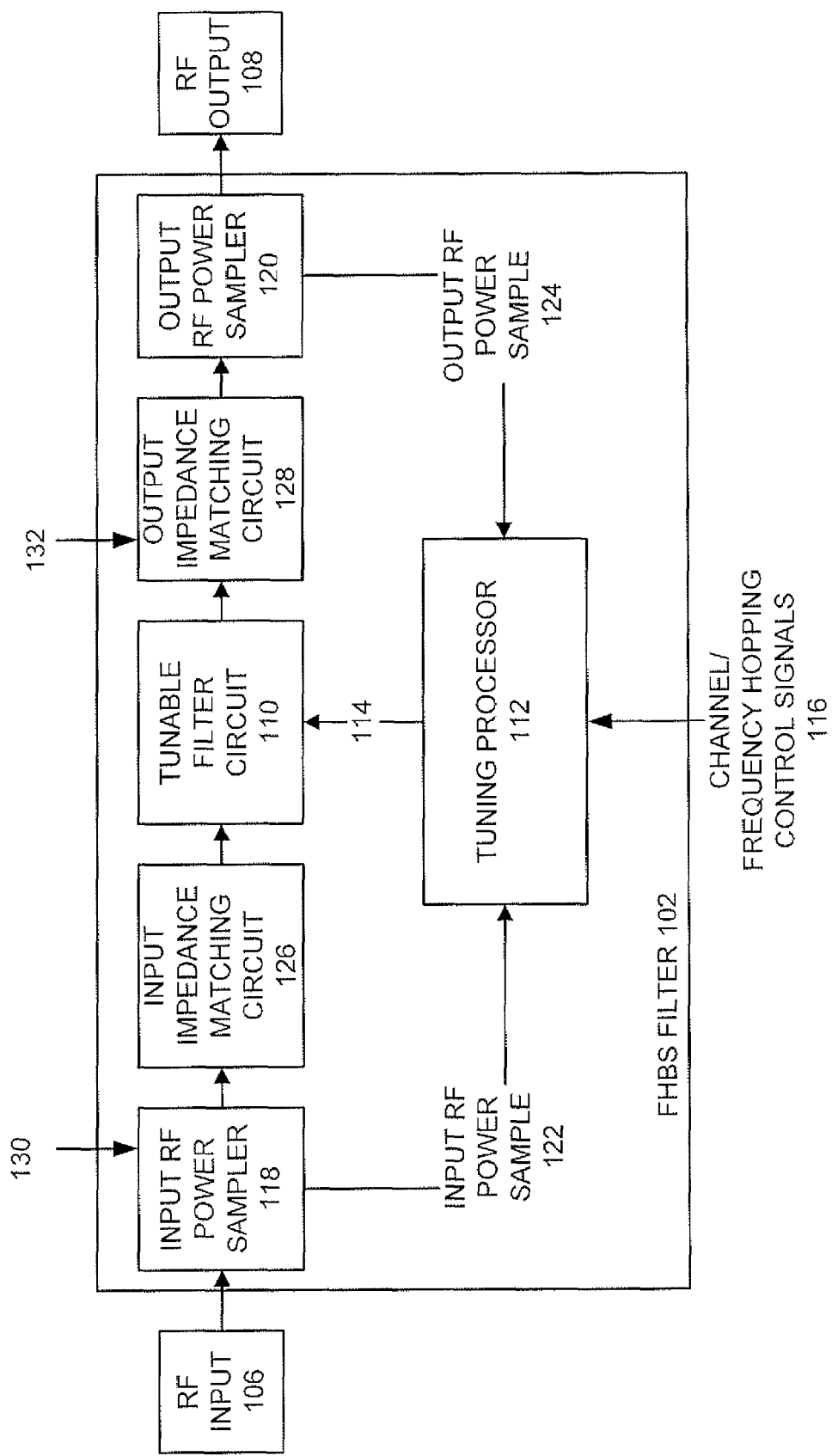
FIG. 1 is a schematic block diagram of exemplary radio frequency (RF) system including digitally tuned, frequency hopping band-stop filter according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe systems and methods for providing digitally tuned band-stop filtering for frequency hopping spread spectrum communications. As described above, frequency-hopping spread spectrum (FHSS) communication is a method of transmitting radio signals by rapidly switching a carrier among many frequency channels, using a pseudorandom sequence known to both the transmitting unit and the remote receiving unit. Although FHSS communications are advantageous for purposes of narrowband interference, security, and bandwidth, FHSS communications are still prone to some types of interference.

For example, collocated RF systems can generate electromagnetic interference (EMI) at receivers due to broadband emissions that are on tune with a receiver. This problem may not be alleviated simply by using particular types of FHSS communications systems, such as SINCGARS, QUICK-LOOK, HAVEQUICK, and Link 16, to name a few.

Typically, unwanted signals would be filtered out by using a one or more band-stop or band-pass filters. These filters are typically used in the signal path of a receiver or transmitter to suppress the undesired signals. As the number and frequencies of interfering sources increases, more filters can be required. However, multiple filters can degrade the signal of interest. Additionally, in the case of FHSS, the signal of interest can be difficult to discern from an interfering signal on-tune with a receiver. As a result, the filters may also, at least partially, filter out the signal of interest, making the signal difficult to discern at a receiving station.

To overcome the limitations of conventional methods, embodiments of the invention provide a digitally tuned, frequency hopping band-stop filter circuit for a transmission system. The tunable band-stop filter circuit can be placed in the transmission path to filter emissions from collocated radio frequency emitters from a transmitter prior to radiation. In operation, the collocated radio frequency emissions are filtered by adjusting the frequency response of the tunable band-stop filter circuit to reduce or eliminate spurious emissions and other interference. A tunable band-stop filter circuit in accordance with an embodiment of the invention includes an adjustable filter circuit and a tuning processor. In operation, the tuning processor is configured to generate a plurality of control signals for coupling or decoupling one or more filter elements in the adjustable filter circuit. These signals can be based on FHSS control signals provided to the tuning processor. The tunable band-stop filter circuit can also include a sampling system for reducing or eliminating attenuation by the tunable band-stop filter circuit if the interfering RF transmitter intended emissions are excessively attenuated.

FIG. 1 is a schematic block diagram of an exemplary radio frequency (RF) system 100 including a digitally tuned frequency hopping band stop (FHBS) filter 102 according to an embodiment of the invention. As shown in FIG. 1, the system 100 includes an RF input element 106 and an RF output element 108, coupled by the FHBS filter 102. The input element 106 can be any RF system that generates a signal to be transmitted. For example, the input element 106 can comprise a countermeasures transmitter which generates emissions to be transmitted by the output element 108. The output element 108 can comprise, for example, a collocated RF emitter distribution system such as cables, diplexers, and antennas, or any other RF component for radiating or broadcasting the signal generated by the input element 106. However, embodiments of the invention are not limited in this regard and the FHBS filter 102 can be used in other configurations.

The FHBS filter 102 includes a tunable filter circuit 110 for modifying a frequency response of the FHBS filter 102. The filter circuit 110 includes a plurality of fixed and selectable filter elements, where the frequency response of the FHBS filter 102 is modified by coupling and decoupling the selectable filter elements from the signal path in the filter 102. The operation and configuration of the tunable filter circuit 110 will be described below in greater detail with respect to FIGS. 2, 3A, 3B, 4A, and 4B. The filter 102 also includes a tuning processor 112. The tuning processor 112 generates binary digital control signals 114 for coupling and decoupling the selectable filter elements of the tunable filter circuit 110 from the signal path of the FHBS filter 102. The digital control signals 114 are generated by the tuning processor 112 based on the FH control signals 116 received by the filter 102. The digital control signals adjust the frequency response of the tunable filter circuit 110 such that for each FHSS frequency channel, the appropriate frequency response is provided. The configuration of the tuning processor 112 and the interaction between the tuning processor 112 and the tunable filter circuit 110 will be described below in greater detail with respect to FIG. 5.

As described above, one aspect of the invention is to provide a filter circuit that includes a sampling system for reducing or eliminating attenuation of the unintended collocated RF emissions if the tunable band-stop filter circuit excessively attenuates intended collocated RF emissions. In FIG. 1, a sampling system is implemented by providing an input RF power sampler 118 and an output RF power sampler 120 at the input and output, respectively, of the FHBS filter 102. The input power sampler 118 can generate an input RF power sample signal 122, indicative of the power of the signal delivered by the RF input element 106. Similarly, the output power sampler 120 can generate an output RF power sample signal 124, indicative of the power of the signal delivered to the RF output element 108. In one embodiment, the samplers 118 and 120 can include directional couplers for passively sampling the input and output signals of the filter 102. In such an embodiment, the signal at the coupled ports of the directional couplers can be used to provide the signals 122 and 124. However, embodiments of the invention are not limited in this regard and other systems and methods for sampling input and output power of the filter 102 can be used in the various embodiments of the invention.

The RF power samples 122 and 124 can be provided to the tuning processor 112 for determining whether excessive attenuation is occurring. For example, if the difference in power at the RF output element 108 and the RF input element 106 is too large, the tuning processor 112 can determine that the current intended collocated RF emissions are at least being partially attenuated and that attenuation needs to be reduced or eliminated, at least temporarily, to allow the signal of interest to be transmitted. Operation of the tuning processor 112 with respect to the power samples 122 and 124 will be described below in greater detail with respect to FIG. 5.

The FHBS Filter 102 can also include impedance matching elements to maximize the power transfer between the RF input element 106 and the RF output element 108. In particular, the FHBS filter 102 can be configured to maximize power transfer across the tunable filter circuit 110 by providing an input impedance matching circuit 126 and an output impedance matching circuit 128 at the input and output, respectively, of the tunable filter circuit 110. The match circuits 126 and 128 can be configured in accordance with the type of signal being provided to the FHBS filter 102 by the RF input element 106. In some embodiments, match tuning signals 130 and 132 can also be provided to matching circuits 126 and 128, respectively, for adjusting or modifying the input and output impedance. Such signals can be provided by the tuning processor 112 or from an external source and allow calibration of the input and output impedance of the FHBS filter 102.

Figure 2:
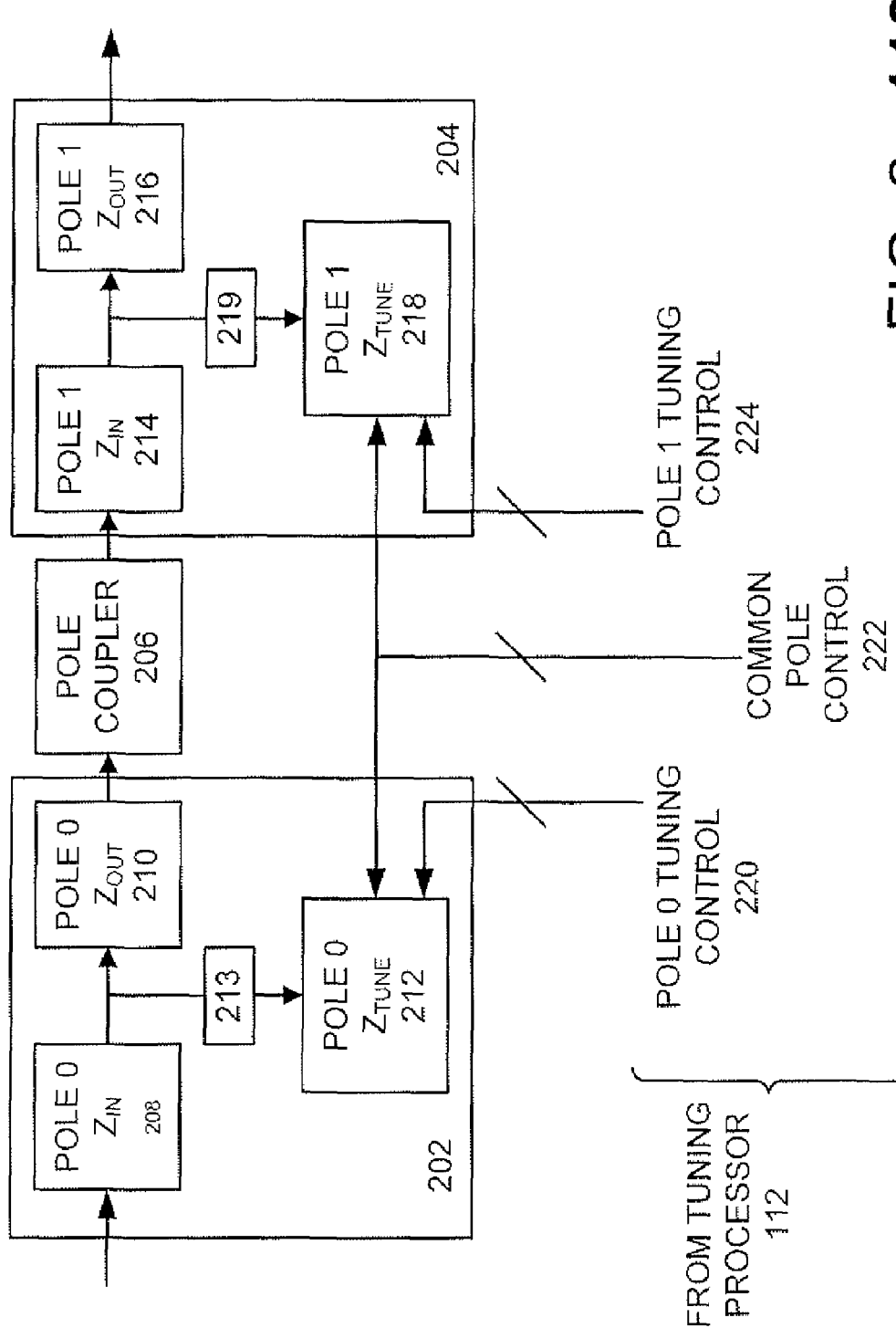
FIG. 2 is block diagram of an exemplary configuration for the tunable filter circuit in FIG. 1, according to an embodiment of the invention.

FIG. 2 is a block diagram of an exemplary configuration for tunable filter circuit 110 in FIG. 1, according to an embodiment of the invention. In general, a notch or band-stop filter can be constructed by a series combination of separate filter sections or poles coupled by reactive components. Such a series combination of filter poles results in an additive attenuation. Such a configuration is shown in FIG. 2

As shown in FIG. 2, the tunable filter circuit 110 can include an input filter pole (POLE 0) 202, an output filter pole (POLE 1) 204, and a pole coupler 206. Each of poles 202, 204 can include any number of fixed and tunable filter elements. For example, the pole 202 includes fixed filter elements 208 and 210 and a tunable filter element 212. In the example shown in FIG. 2, fixed filter elements 208 and 210 provide matching input and output impedances, respectively for the tunable filter element 212. Similarly, the pole 204 includes fixed filter elements 214 and 216 and a tunable filter element 218. In the various embodiments of the invention, such fixed and tunable filter elements can be the same or different for each pole. The selection and design of filter elements can be based on the characteristics of the FHSS communications signals from the input element 106 and the range of frequencies to be attenuated by filter 102. Furthermore, RF inductor elements 213 and 219 can be used in conjunction with tunable filter elements 212 and 218 to set the resonant frequency of tunable filter poles 202 and 204, respectively.

The frequency response of tunable filter poles 202 and 204 can be adjusted via one or more control signals from the tuning processor 112. These control signals couple and decouple one or more portions of tunable filter elements 212 and 218 in conjunction with inductor elements 213 and 219, respectively. The control signals can include control signals exclusively for one of tunable filter elements 212 and 218 and/or control signals common to both tunable filter elements. For example, as shown in FIG. 2, the tunable filter element 212 receives POLE 0 tuning control signals 220 and common pole control signals 222. Similarly, the tunable filter element 218 receives POLE 1 tuning control signals 224 and the common pole control signals 224. In such a configuration, common signals 222 can be used to provide a gross adjustment for the desired frequency response, while pole signals 220 and 224 can be used for fine tuning the frequency response. Accordingly, the pole signals 220 and 224 may be the same or different, depending on the configuration of poles 202 and 204 and the frequency of interest. Generation of these control signals will be described below in greater detail with respect to FIG. 4.

The tunable filter elements 212 and 218 can be configured to use any number of digitally controlled filter element components to allow various combinations. Such a configuration allows one or more of the filter element components to be used for providing band-stop frequency characteristics for more than one of the FHSS frequency channels. That is, rather than providing a different filter element component for each FHSS frequency channel, different sets of filter element components can be combined to provide the desired frequency response. Such a configuration can reduce the overall number of components needed for the tunable filter circuit.

As described above, the digital control signals can be used to control selection of the filter element components by coupling or decoupling one or more filter element components from the signal path. In the various embodiments of the invention, some filter element components can be configured to be normally "off" (i.e., decoupled if the digital control signal is "LO") and some filter element components can be configured to be normally "on" (i.e., coupled unless the digital control signal is "HI"). This is schematically illustrated in FIGS. 3A and 3B.

Figure 3A:
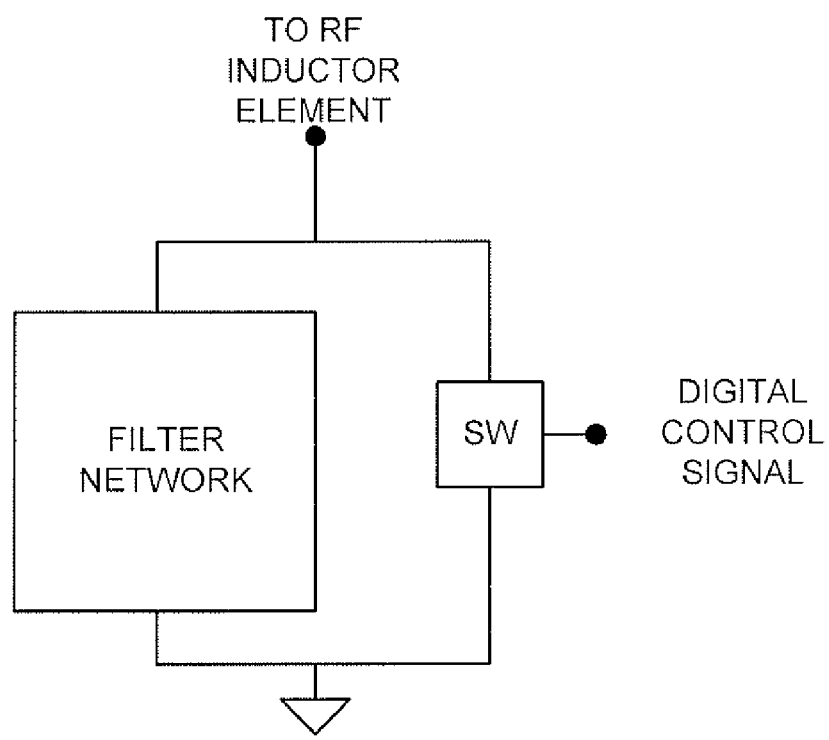
FIG. 3A shows a schematic diagram of a first filter element component configuration in accordance with an embodiment of the present invention.

FIG. 3A shows a schematic diagram of a filter element component configuration in accordance with an embodiment of the present invention. In this configuration, the switch and the filter network are arranged in parallel. Therefore, the filter network is enabled when the switch is open and is decoupled when the switch is closed. FIG. 3B shows a schematic diagram of another filter element component configuration in accordance with an embodiment of the present invention. In this configuration, the filter network is arranged in series with the switch. Therefore, the filter network is enabled only when the switch is closed and is decoupled when the switch is open In the various embodiments of the invention, a tunable filter element can include any number of normally "on" or normally "off" filter element components. Additionally, any combination of different filter element component arrangements (parallel or serial) can be used. The switch elements for these filter element components can comprise any type of electrically controlled switch elements, including MOS transistor switches, bipolar junction transistor switches, and diode switches (P-N, PIN, MOS, etc. . . . ), to name a few. In some embodiments, the type of switches used can be selected to reduce the amount of circuitry or the number of control signals required to operate the tunable filter element. For example, diode-type switches can be used to reduce the number of terminals required for a switch. This is illustrated in FIGS. 4A and 4B.

Figure 4A:
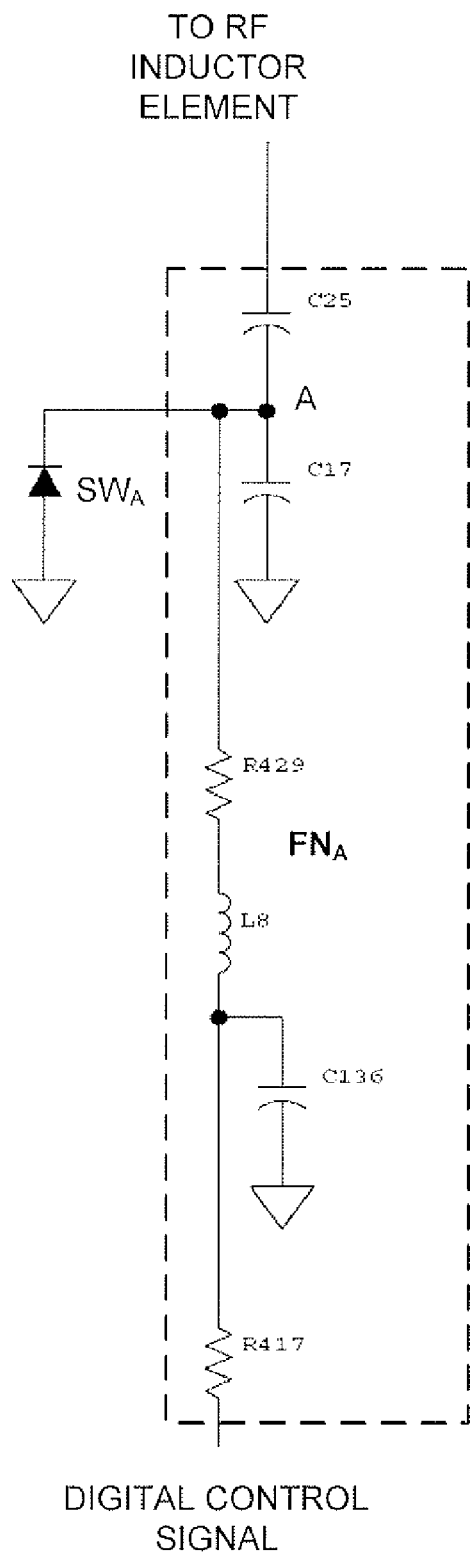
FIGS. 4A and 4B show exemplary filter element components using diode switches in accordance with an embodiment of the present invention.
Figure 4B:
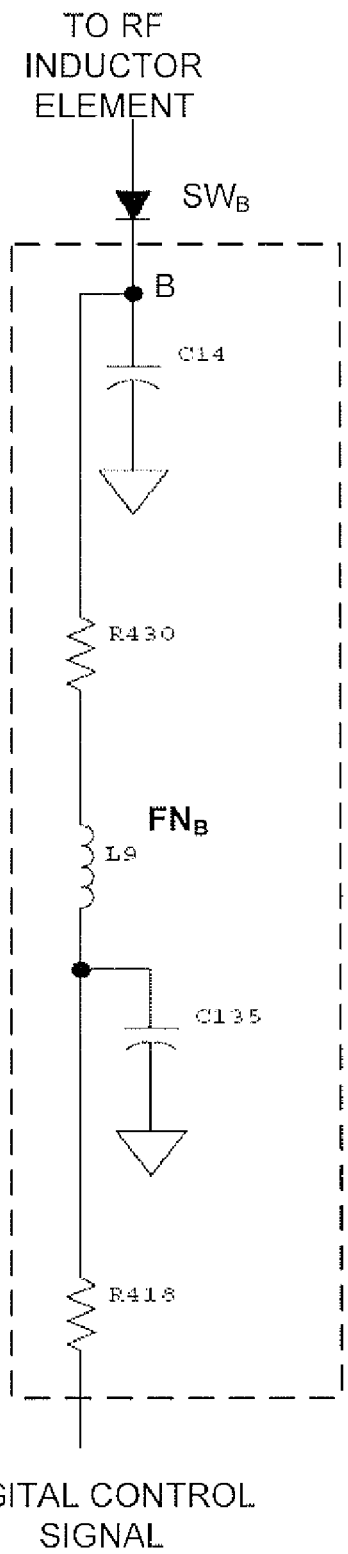

FIGS. 4A and 4B show exemplary filter element components using diode switches in accordance with an embodiment of the present invention. FIG. 4A shows a filter element component in a normally "off" configuration and having a diode switch ($SW_A$) in parallel with the filter network ($FN_A$), similar to the configuration in FIG. 3A. In operation, the diode switch is normally forward biased (i.e., "on") if the digital control signal is "LO" (i.e., <0V). The switch diode, acting as a clamp, shorts node A between capacitors C25 and C17 in the filter network to ground. Therefore, the portion of the filter network coupled to the RF inductor element is also shorted to ground, effectively decoupling the filter network from RF inductor element. However, if a "HI" digital control signal is provided, the diode switch is reverse-biased. Accordingly, node A is no longer shorted to ground and the filter network is effectively coupled to the RF inductor element. The filter network can then modify the frequency response of the filter pole.

Figure 3B:
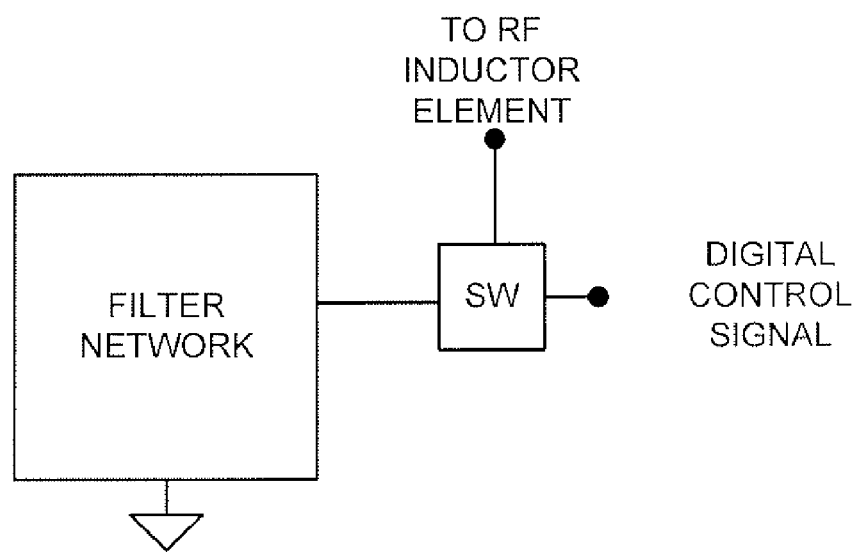
FIG. 3B shows a schematic diagram of a second filter element component configuration in accordance with an embodiment of the present invention.

FIG. 4B shows a filter element component in a normally "on" configuration and having a diode switch ($SW_B$) in series with the filter network ($FN_B$), similar to the configuration in FIG. 3B. In operation, the diode switch ($SW_B$) is normally forward biased (i.e., "on") if the digital control signal is "LO" (i.e., <0V), coupling node B of the filter network to the RF inductor element. The filter network can then modify the frequency response of the filter pole. However, if a "HI" digital control signal is provided, the diode switch become reverse-biased and is effectively open. Accordingly, node B is decoupled from the RF inductor element and does not modify the frequency response of the filter pole.

The exemplary configurations of filter element components in FIGS. 3A, 3B, 4A, and 4B are presented by way of illustration and not by way of limitation. In the various embodiments of the invention, other configurations of filter element components can be used for the tunable filter elements.

Figure 5:
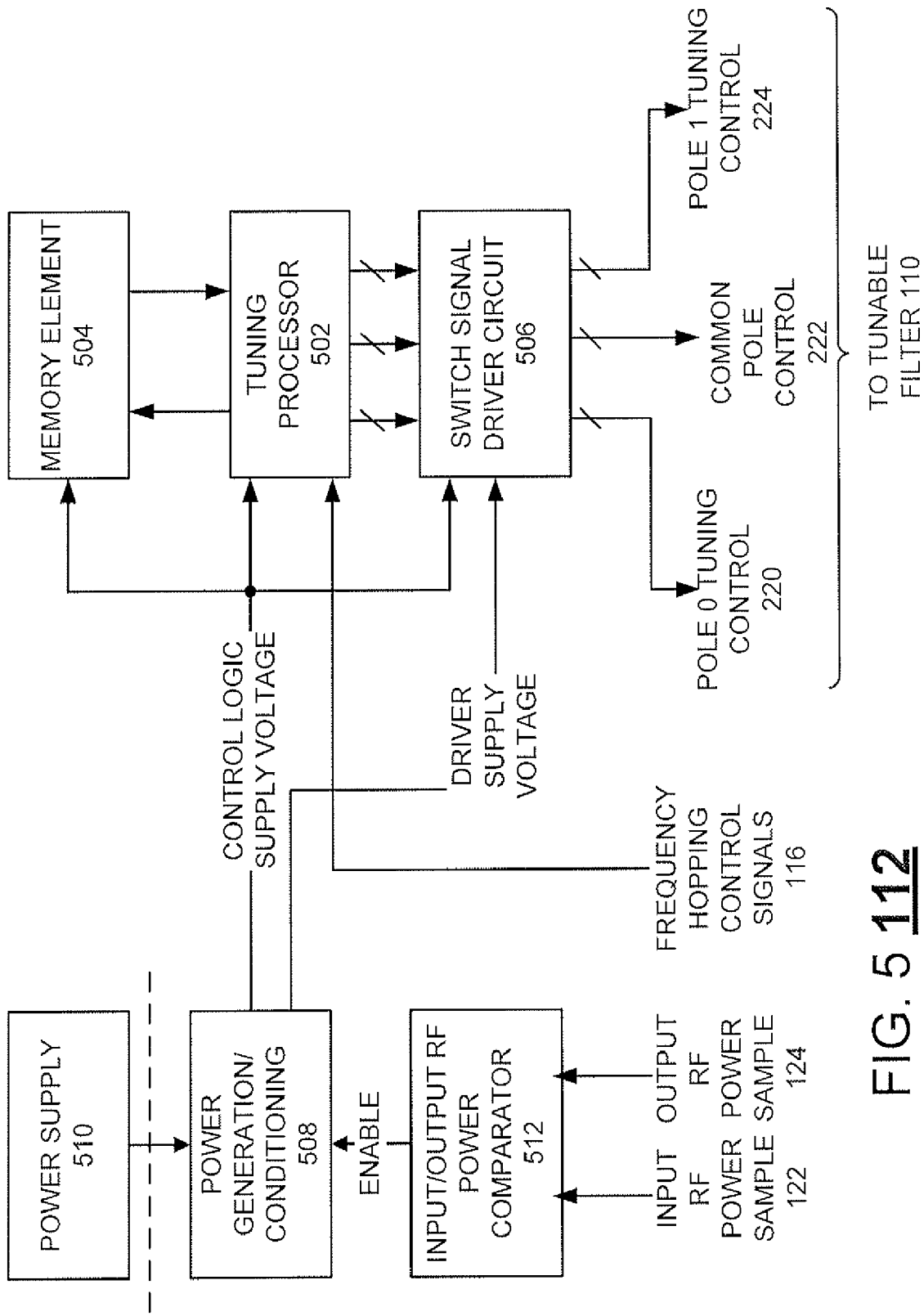
FIG. 5 is block diagram of an exemplary configuration for the tuning processor in FIG. 1, in accordance with an embodiment of the invention.

As described above, the coupling and decoupling of filter element components in the tunable filter elements is achieved via digital control signals generated by a tuning processor. FIG. 5 is block diagram of an exemplary configuration for the tuning processor 112 in FIG. 1, in accordance with an embodiment of the invention. As shown in FIG. 5, the tuning processor 112 can include a processing element 502, a memory element 504, a driver circuit 506, a power generation/conditioning element 508 coupled to an internal or external power supply 510, and an RF power comparator 512.

In operation, the processing element 502 receives FH control signals 116. The FH control signals 116 indicate a current frequency channel of the FHSS transmission. Responsive to receiving this current frequency channel information, the processing element 502 accesses the memory element 504 to retrieve a pre-defined set of control signals for filter poles in the tunable filter 110. Each set of control signals can define the frequency range, or one or more "victim" frequencies to be attenuated by the tunable filter 110 for the current FHSS frequency channel.

In the various embodiments of the invention, the "victim" frequencies are identified a priori. That is, for the frequency range of the FHBS, the frequencies and the associated set of control signals are pre-determined. Based on these "victim" frequencies, the appropriate set of filter element components for providing a desired attenuation for each of the FHSS frequency channels can be identified. The corresponding set of control signals for coupling this set of filter element components can then be stored in memory element 504 and associated with a FHSS frequency channel. That is, for each filter element component in each pole, a "HI" or "LO" signal value is stored in the memory element 504.

Once the processing element 502 has retrieved the set of control signals associated with a current FHSS frequency, the control signals can be amplified by the driver circuit 506. In some embodiments, the magnitude of the voltage levels or the amount of power that can be generated by processing element is limited and may not be sufficient for the filter element components. For example, in the case of a diode switch in tunable filter circuit 110, the logic "HI" of the processing element 502 may not correspond to a voltage level sufficiently high to reverse bias the diode. In another example, the logic "HI" of the processing element 502 may not correspond to a voltage level sufficient high to toggle operation of a high power transistor. In such instances, the driver circuit 506 can be used amplify the signals from the processing element 502 to appropriate levels for the components in the filter poles of the tunable filter circuit 110. The control signals can then be directed to the tunable filter circuit 110. As described above, signals can be directed exclusively to the poles of the tunable filter circuit 110 (POLE 0 and POLE 1 tuning control) and/or to both poles (Common pole control).

As shown in FIG. 5, the processing element 502, the memory element 504, and the driver circuit 506 can receive supply voltage signals from the power generation/conditioning element 508. In one embodiment, the power generation/condition element 508 can be configured to generate all power supply signals needed for the tuning processor 112. For example, as shown in FIG. 5, the element 508 generates logic supply for operating the logic portions of elements 502, 504 and the driver circuit 506. The element 508 can also generate driver supply voltages for the driver circuit 506. However, the invention is not limited in this regard and other configurations, including one or more elements, can be used to generate the power supply signals.

As described above, a tunable band-stop filter circuit in accordance with the various embodiments of the present invention can also include a sampling system for reducing or eliminating attenuation by the tunable band-stop filter circuit if the attenuation excessively reduces signal power. One of ordinary skill in the art will recognize that a filter element will always produce some amount of signal attenuation. However, in some cases the "victim" frequencies and the emissions from collocated radio frequency emitter frequencies will not be perfectly aligned to provide proper attenuation of only interfering signals. For example, imperfections in the transmission system and the tunable filter circuit can cause some variation in the interfering collocated radio frequency emitter frequency channels and/or frequencies being attenuated. As a result, one or more actual interfering collocated radio frequency emissions may be inadvertently attenuated by the tunable filter circuit.

Accordingly, in the various embodiments of the invention the tuning processor can be configured to detect such instances and limit or eliminate the attenuation caused by the tunable filter circuit. In the tuning processor shown in FIG. 5, this is achieved via a power comparator 512. As previously described with respect to FIG. 1, the input power sampler 118 and the output power sampler 120 are used to sample the power of the signal provided by the RF input element 106 at the input and output, respectively, of filter 102. The power sample signals 122 and 124 are provided to the tuning processor 112. As shown in FIG. 5, the power comparator 512 receives these signals. Upon receipt of these signals, the power comparator 512 compares these signals to determine if signal power has been reduced excessively. For example, power comparator can determine a difference or a ratio of the signals. This difference or ratio can then compared to pre-defined criteria. That is, if the difference between the signals is greater than a threshold value, a determination of excessive attenuation can be made. Similarly, if the ratio of input to output signal power is greater than a threshold value, a similar determination can be made.

If the power comparator 512 determines that excessive attenuation is occurring, the power comparator 512 can generate signals for the tuning processor 112 to reduce or eliminate attenuation by the tunable filter circuit 110. In one embodiment, the power comparator 512 can be configured to generate an enable signal (ENABLE) for the power generation/conditioning element 508 and/or processing element 502 as long as the difference or ratio of power sample signals is less than the threshold value. Once the threshold is exceeded, the power comparator 512 stops providing the enable signal (s). In such an embodiment, the power element 508 and/or the processing element 502 can be configured to only operate normally if the enable signal is detected. If the enable signal is not detected, the power element 508 and/or the processing element 502 can be configured to disabled their outputs or to output only a set of default values. For example, in the case of the processing element 502, the processing element 502 can be configured to generate a default set of output signals that limit or eliminate the amount of attenuation provided by the tunable filter circuit 110. Alternatively, the power element 508 can be configured to reduce or eliminate the supply voltage level, effectively preventing "HI" signals from being delivered to the tunable filter circuit 110. In such an embodiment, a set of control signals that are all "LO" results in a configuration of the tunable filter circuit 110 that limits or eliminates the amount of attenuation provided by the tunable filter circuit 110.

In light of the foregoing description of the invention, it should be recognized that one or more portions of the invention, such as the tuning processor, can be realized in hardware, software, or a combination of hardware and software. A system in accordance with an embodiment of the invention can be realized in a centralized fashion in one processing system, or in a distributed fashion where different elements therein are spread across several interconnected processing systems. Any kind of computer system, or other apparatus adapted for carrying out the methods described herein, is suited. A typical combination of hardware and software could be a general purpose computer processor, with a computer program that, when being loaded and executed, controls the computer processor such that it carries out the methods described herein. Alternatively, an integrated circuit, such as an application specific integrated circuit (ASIC), and/or a field programmable gate array (FPGA) could also be used to achieve a similar result.

One or more portions of the invention can also be embedded in a computer program product, which comprises all the features enabling the implementation of the methods described herein, and which, when loaded in a computer system, is able to carry out these methods. Computer program or application in the present context means any expression, in any language, code or notation, of a set of instructions intended to cause a system having an information processing capability to perform a particular function either directly or after either or both of the following a) conversion to another language, code or notation; b) reproduction in a different material form. Additionally, the description above is intended by way of example only and is not intended to limit the invention in any way, except as set forth in the following claims.

Applicants present certain theoretical aspects above that are believed to be accurate that appear to explain observations made regarding embodiments of the invention. However, embodiments of the invention may be practiced without the theoretical aspects presented. Moreover, the theoretical aspects are presented with the understanding that Applicants do not seek to be bound by the theory presented.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A digitally-tunable filter, comprising:
    a tunable filter circuit for generating an output signal by processing an input signal based at least on a plurality of filter control signals;
    an input power sampler for sampling an input power of said input signal;
    an output power sampler for sampling an output power of said output signal;
    a tuning processor for generating said plurality of filter control signals based on at least one channel control signal associated with a current communications channel and a comparison of said input and said output powers,
    wherein said plurality of control signals configure said tunable filter circuit to attenuate at least a portion of said input signal if a difference between said input power and said output power is less than a threshold value.

2. The digitally-tunable filter of claim 1, wherein said tunable filter circuit comprises at least one input pole and at least one output pole, wherein said plurality of filter control signals comprises a plurality of first pole control signals for said input pole, a plurality of second pole control signals for said output pole, and a plurality of common pole signals for said input and said output poles.

3. The digitally-tunable filter of claim 2, wherein said input pole and said output pole each comprise a plurality of fixed filter elements and a plurality of adjustable filter elements, said plurality of adjustable filter elements comprising a plurality of switches controlled by said plurality of filter control signals.

4. The digitally-tunable filter of claim 1, further comprising:
    an input impedance matching circuit coupled to an input of said tunable filter circuit; and
    an output impedance matching circuit coupled to an output of said tunable filter circuit.

5. The digitally-tunable filter of claim 1, wherein said input power sampler comprises a first directional coupler having a first incident port for receiving said input signal, a first transmitted port coupled to an input of said tunable filter circuit, and a first coupled port for providing said sampled input power to said tuning processor, and wherein said output power sampler comprises a second directional coupler having a second incident port coupled to an output of said tunable filter circuit, a second transmitted port for providing said output signal, and a second coupled port for providing said sampled output power to said tuning processor.

6. The digitally-tunable filter of claim 1, wherein said tuning processor further comprises a memory element for storing a plurality of control signal configurations associated with a plurality of communications channels, and wherein said tuning processor generates said plurality of filter control signals based on at least one of said plurality of control signal configurations associated with said current communications channel.

7. The digitally-tunable filter of claim 1, wherein said tuning processor further comprises a comparator element for generating an enable signal for said tuning processor if said difference is less than a threshold value.

8. The digitally-tunable filter of claim 7, wherein said tuning processor is configured to modify said plurality of filter control signals to reduce attenuation of said input signal in said tunable filter circuit if said enable signal is not present.

9. The digitally-tunable filter of claim 7, wherein said tuning processor further comprises a driver circuit for amplifying said plurality of filter control signals to bias one or more components of said tunable filter circuit, and wherein said driver circuit is disabled if said enable signal is not present.

10. A method of reducing interference in a communications system, comprising a tunable filter circuit for receiving an input signal and outputting an output signal, and a tuning processor for generating a plurality of filter control signals for said tunable filter circuit, the method comprising:
    generating said plurality of filter control signals based on at least one channel control signal associated with a current communications channel,
    generating said output signal with said tunable filter circuit by processing said input signal based at least on said plurality of filter control signals;
    sampling an input power of said input signal;
    sampling an output power of said output signal; and
    modifying said plurality of filter control signals based on a comparison of said input and said output powers,
    wherein said plurality of control signals configure said tunable filter circuit to attenuate at least a portion of said input signal if a difference between said input power and said output power is less than a threshold value.

11. The method of claim 10, wherein said generating said plurality of filter control signals further comprises generating a plurality of first pole control signals for an input pole of said tunable filter circuit, a plurality of second pole control signals for an output pole of said tunable filter circuit, and a plurality of common pole signals for said input and said output poles.

12. A method of reducing interference in a communications system, comprising a tunable filter circuit for receiving an input signal and outputting an output signal, and a tuning processor for generating a plurality of filter control signals for said tunable filter circuit, the method comprising:
    generating said plurality of filter control signals based on at least one channel control signal associated with a current communications channel,
    generating said output signal with said tunable filter circuit by processing said input signal based at least on said plurality of filter control signals;
    sampling an input power of said input signal;
    sampling an output power of said output signal; and
    modifying said plurality of filter control signals based on a comparison of said input and said output powers;
    wherein said plurality of control signals configure said tunable filter circuit to attenuate at least a portion of said input signal if a difference between said input power and said output power is less than a threshold value; and
    wherein said sampling said input power further comprises sampling said input signal using a first directional coupler having a first incident port for receiving said input signal, a first transmitted port coupled to an input of said tunable filter circuit, and a first coupled port for providing said sampled input power to said tuning processor, and wherein said sampling said output power further comprises sampling said output signal using a second directional coupler having a second incident port coupled to an output of said tunable filter circuit, a second transmitted port for providing said output signal, and a second coupled port for providing said sampled output power to said tuning processor.

13. The method of claim 10, wherein said generating said plurality of filter control signals further comprises amplifying said plurality of filter control signals to match a voltage level of said tunable filter circuit.

14. A method of reducing interference in a communications system, comprising a tunable filter circuit for receiving an input signal and outputting an output signal, and a tuning processor for generating a plurality of filter control signals for said tunable filter circuit, the method comprising:
    generating said plurality of filter control signals based on at least one channel control signal associated with a current communications channel,
    generating said output signal with said tunable filter circuit by processing said input signal based at least on said plurality of filter control signals;
    sampling an input power of said input signal;
    sampling an output power of said output signal; and
    modifying said plurality of filter control signals based on a comparison of said input and said output powers;
    wherein said plurality of control signals configure said tunable filter circuit to attenuate at least a portion of said input signal if a difference between said input power and said output power is less than a threshold value; and
    wherein said generating said plurality of filter control signals further comprises accessing a plurality of stored control signal configurations associated with a plurality of communications channels and generating said plurality of filter control signals based on at least one of said plurality of control signal configurations associated with said current communications channel.

15. The method of claim 10, wherein said modifying further comprises generating an enable signal for said tuning processor if said difference is less than a threshold value.

16. A method of reducing interference in a communications system, comprising a tunable filter circuit for receiving an input signal and outputting an output signal, and a tuning processor for generating a plurality of filter control signals for said tunable filter circuit, the method comprising:
    generating said plurality of filter control signals based on at least one channel control signal associated with a current communications channel,
    generating said output signal with said tunable filter circuit by processing said input signal based at least on said plurality of filter control signals;
    sampling an input power of said input signal;
    sampling an output power of said output signal; and
    modifying said plurality of filter control signals based on a comparison of said input and said output powers;
    wherein said plurality of control signals configure said tunable filter circuit to attenuate at least a portion of said input signal if a difference between said input power and said output power is less than a threshold value; and
    wherein modifying further comprises generating an enable signal for said tuning processor if said difference is less than a threshold value and adjusting said plurality of filter control signals to reduce attenuation of said input signal in said tunable filter circuit if said enable signal is not present.

17. The method of claim 14, wherein said modifying further comprises disabling an output of said tuning processor if said enable signal is not present.

18. A digitally-tunable filter circuit, comprising:
- a tunable filter circuit comprising a plurality of fixed filter elements for processing an input signal to generate an output signal and a plurality of selectable filter elements for modifying a frequency response of said plurality of fixed filter elements based on at least a plurality of filter control signals;
- an input power sampler for sampling an input power of said input signal;
- an output power sampler for sampling an output power of said output signal;
- a tuning processor for generating said plurality of filter control signals based on at least one frequency hopping (FH) control signal associated with a current FH victim receive frequency for said input signal and a comparison of said input and said output powers, wherein said plurality of control signals configure said tunable filter circuit to attenuate a portion of said input signal if a difference between said input power and said output power is less than a threshold value.

19. The band-stop filter circuit of claim 18, wherein said tunable filter circuit comprises at least one input pole and at least one output pole, wherein said plurality of filter control signals comprises a plurality of first pole control signals for said input pole, a plurality of second pole control signals for said output pole, and a plurality of common pole signals for said input and said output poles.

20. The band-stop circuit of claim 18, wherein said tuning processor further comprises a memory element for storing a plurality of control signal configurations associated with a plurality of FH channels, and wherein said tuning processor generates said plurality of filter control signals based on at least one of said plurality of control signal configurations associated with said current FH channel.

\* \* \* \* \*